United States Patent
Tanabe et al.

(10) Patent No.: US 11,443,963 B2
(45) Date of Patent: Sep. 13, 2022

(54) SUBSTRATE PROCESSING METHOD AND SUBSTRATE PROCESSING APPARATUS

(71) Applicant: KIOXIA CORPORATION, Tokyo (JP)

(72) Inventors: Mana Tanabe, Yokohama Kanagawa (JP); Kosuke Takai, Yokohama Kanagawa (JP); Kenji Masui, Kawasaki Kanagawa (JP); Kaori Umezawa, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 139 days.

(21) Appl. No.: 16/557,705

(22) Filed: Aug. 30, 2019

(65) Prior Publication Data
US 2020/0294822 A1    Sep. 17, 2020

(30) Foreign Application Priority Data
Mar. 15, 2019    (JP) .............................. JP2019-048424

(51) Int. Cl.
*H01L 21/67* (2006.01)
*B08B 7/00* (2006.01)
*H01L 21/02* (2006.01)

(52) U.S. Cl.
CPC ...... *H01L 21/67051* (2013.01); *B08B 7/0014* (2013.01); *H01L 21/02057* (2013.01); *H01L 21/67103* (2013.01)

(58) Field of Classification Search
CPC ....... B08B 7/0014; G03F 1/82; G03F 7/0002; H01L 21/02057; H01L 21/67051; H01L 21/67103; H01L 21/67109
USPC ................. 134/4, 5, 19, 26, 30, 18
See application file for complete search history.

(56) References Cited

U.S. PATENT DOCUMENTS

| | | | | |
|---|---|---|---|---|
| 4,883,775 A * | 11/1989 | Kobayashi | ........ | H01L 21/67057 257/E21.228 |
| 5,857,474 A * | 1/1999 | Sakai | ................ | H01L 21/67051 134/102.3 |
| 6,783,599 B2 * | 8/2004 | Gale | ................ | H01L 21/67051 134/40 |

(Continued)

FOREIGN PATENT DOCUMENTS

| | | |
|---|---|---|
| JP | 2008130951 A | 6/2008 |
| JP | 4906418 B2 | 3/2012 |

(Continued)

OTHER PUBLICATIONS

Araki et al., JP 2013077596 A, Machine Translation filed Dec. 13, 2019. (Year: 2019).*
Sugimoto et al. , JP 2012212758 A, Machine Translation filed Dec. 13, 2019). (Year: 2019).*

*Primary Examiner* — Duy Vu N Deo
*Assistant Examiner* — Christopher Remavege
(74) *Attorney, Agent, or Firm* — Kim & Stewart LLP

(57) ABSTRACT

A substrate processing method includes a process of cooling a substrate to below a freezing point of a processing liquid using a cooling fluid brought into contact with the substrate opposite. While the substrate is cooled to below the freezing point of the processing liquid, a droplet of processing liquid is dispensed onto a surface of the substrate at a specified location of a foreign substance. The droplet then forms a frozen droplet portion at the specified location. The frozen droplet portion is then thawed.

12 Claims, 4 Drawing Sheets

(56) References Cited

U.S. PATENT DOCUMENTS

| | | | | |
|---|---|---|---|---|
| 6,864,458 B2* | 3/2005 | Widmann | ............. | B08B 7/0014 |
| | | | | 219/121.69 |
| 7,410,545 B2* | 8/2008 | Matsubara | ........ | H01L 21/02052 |
| | | | | 134/32 |
| 7,823,597 B2* | 11/2010 | Miya | ..................... | B08B 7/0092 |
| | | | | 134/105 |
| 7,867,337 B2* | 1/2011 | Izumi | ................ | H01L 21/67742 |
| | | | | 134/4 |
| 7,942,976 B2* | 5/2011 | Miya | ................. | H01L 21/02057 |
| | | | | 134/4 |
| 8,623,146 B2* | 1/2014 | Kato | ................. | H01L 21/67051 |
| | | | | 134/4 |
| 2004/0140298 A1* | 7/2004 | Widmann | ............. | B08B 7/0014 |
| | | | | 219/121.69 |
| 2008/0121252 A1* | 5/2008 | Miya | ..................... | B08B 7/0092 |
| | | | | 134/4 |
| 2016/0059274 A1* | 3/2016 | Miya | ......................... | B08B 3/10 |
| | | | | 134/95.3 |
| 2017/0274427 A1* | 9/2017 | Sakurai | ............. | H01L 21/67051 |
| 2018/0047559 A1* | 2/2018 | Kamiya | ............ | H01L 21/68764 |

FOREIGN PATENT DOCUMENTS

| | | | |
|---|---|---|---|
| JP | 2012212758 A | * | 11/2012 |
| JP | 2012212758 A | | 11/2012 |
| JP | 2013077596 A | * | 4/2013 |
| JP | 2013077596 A | | 4/2013 |

* cited by examiner

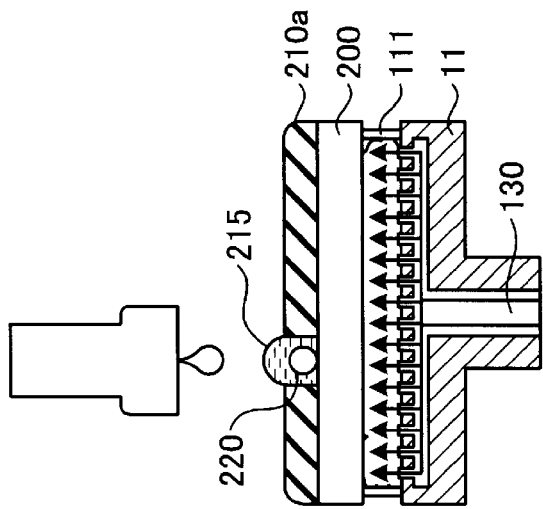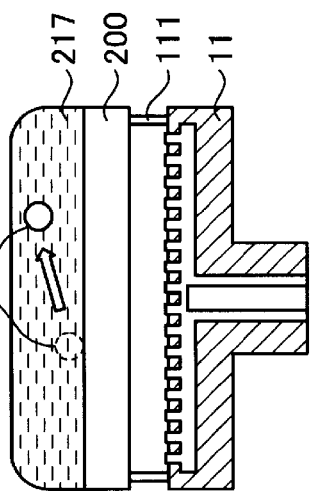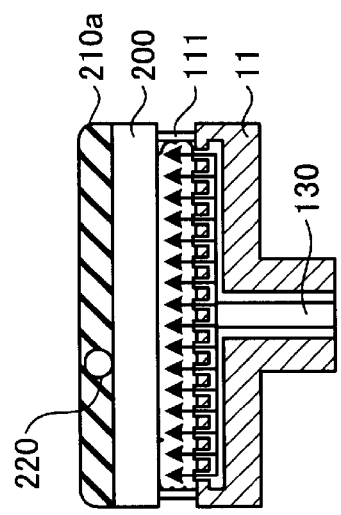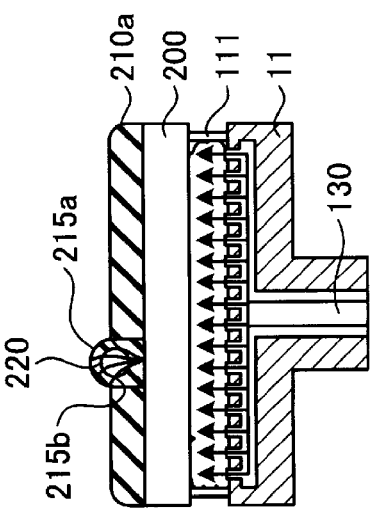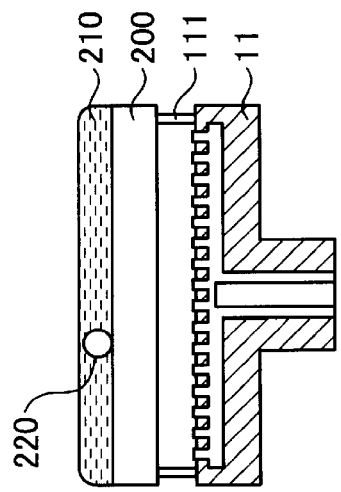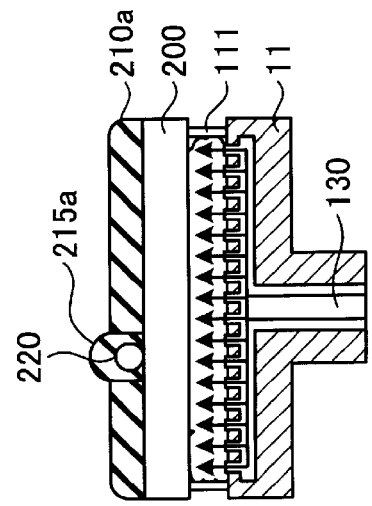

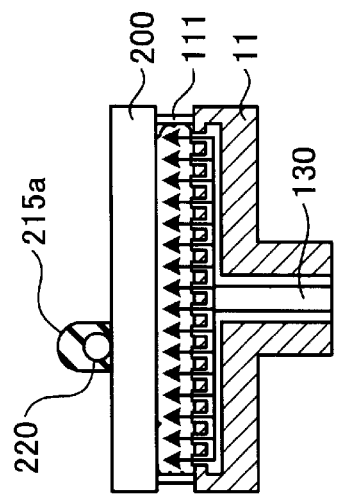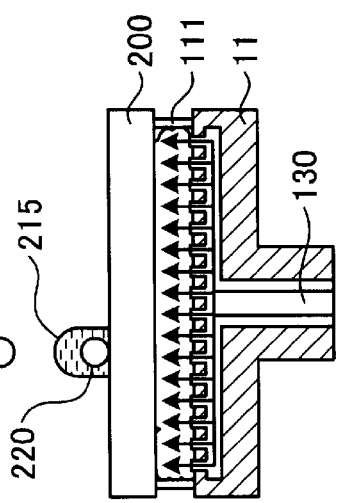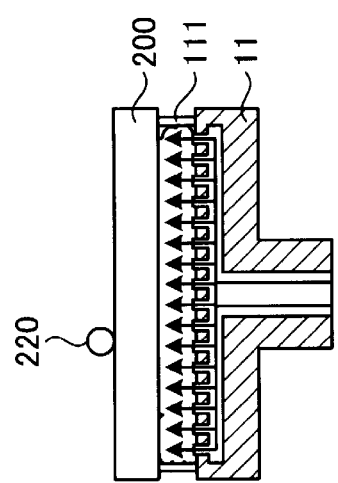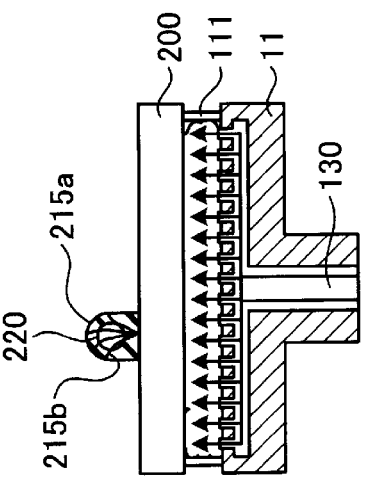

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-048424, filed Mar. 15, 2019, the entire contents of which are incorporated herein by reference.

FIELD

Embodiments described herein relate generally to a substrate processing method and a substrate processing apparatus.

BACKGROUND

A cleaning technique is known in which a foreign substance on a front surface of a substrate is removed by freezing a liquid film formed on the front surface by cooling a back surface of the substrate with a cooling medium, and then removing the frozen film.

However, in the related art, the cleaning is performed by repeatedly forming the frozen film over the entire front surface and thawing the frozen film. Therefore, there is a risk that a pattern on the substrate in an area where the foreign substance is not present may be damaged.

DESCRIPTION OF THE DRAWINGS

FIGS. 1A to 1F are diagrams schematically illustrating aspects of a substrate processing method according to a first embodiment.

FIGS. 4A to 4D are diagrams schematically illustrating aspects of a substrate processing method according to a second embodiment.

DETAILED DESCRIPTION

Figure 2:
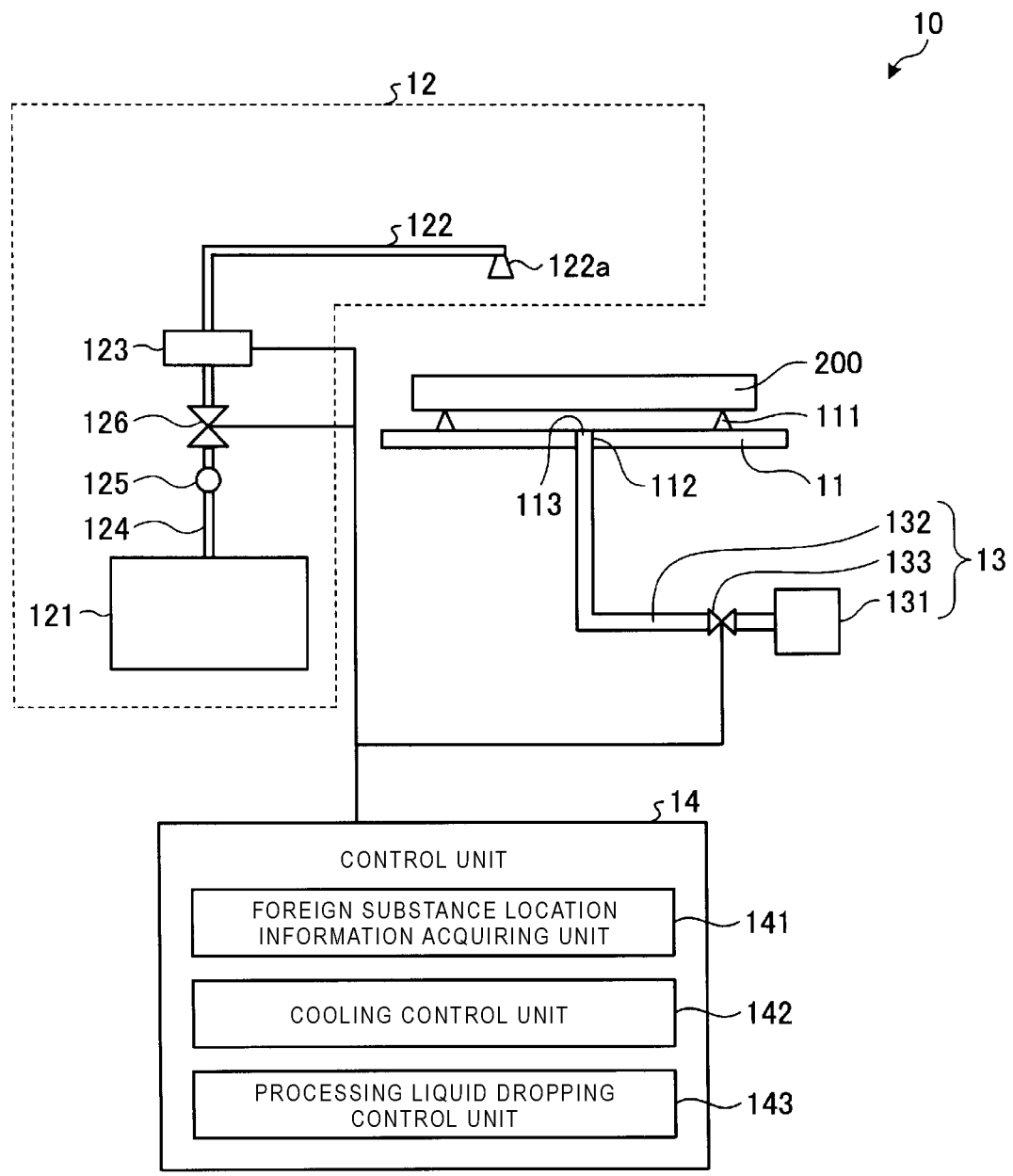
FIG. 2 is a diagram schematically illustrating an example of a substrate processing apparatus according to a first embodiment.

Embodiments provide a substrate processing method and a substrate processing apparatus by which pattern damage can be reduced.

In general, according to one embodiment, a substrate processing method includes: cooling a substrate having a first surface to below a freezing point of a processing liquid using a cooling fluid brought into contact with a second surface of the substrate opposite the first surface. While the substrate is cooled to below the freezing point of the processing liquid, a droplet of processing liquid is dispensed onto the first surface at a specified location of a foreign substance and a frozen droplet portion is thereby formed at the specified location. The frozen droplet portion is then thawed for removal or the like.

Hereinafter, example substrate processing methods and substrate processing apparatuses according to an present disclosure will be described with reference to the accompanying drawings. The present disclosure is not limited to these example embodiments.

First Embodiment

FIGS. 1A to 1F are diagrams schematically illustrating aspects of a substrate processing method according to a first embodiment. As illustrated in FIG. 1A, a processing target such as substrate 200 is placed on a stage 11. The substrate 200 is placed with the surface to be cleaned facing upward. A foreign substance 220 is adhered to the substrate 200. The substrate 200 is supported on a support portion 111 of the stage 11 such that a gap is created between the stage 11 and a lower surface of the substrate 200. The substrate 200 can be a template used in imprint processing, a mask used in lithographic processing, or a semiconductor substrate. A processing liquid film 210 is formed on the upper surface of the substrate 200. For example, a processing liquid dispensed onto the substrate 200 and spread over the entire upper surface of the substrate 200 by spin coating so as to form the processing liquid film 210. In this example, pure water or deionized water may be used as the processing liquid.

As illustrated in FIG. 1B, a cooling medium 130 at a temperature lower than the freezing point of the processing liquid is supplied to a lower surface side of the substrate 200 to freeze (solidify) the processing liquid film 210. As a result, a frozen layer 210a is formed by freezing of the processing liquid film 210 from a substrate 200 side. The frozen layer 210a has a thickness such that the frozen layer 210a can be melted to by a droplet of the processing liquid dispensed to a location corresponding to the foreign substance 220. The frozen layer 210a functions as a protective film in areas other than the location of the foreign substance 220. As a cooling medium, a gas, such as nitrogen that has been cooled to a temperature lower than the freezing point of the processing liquid, or a liquid, such as liquid nitrogen or a liquid fluorocarbon, can be used.

Then, as illustrated in FIG. 1C, a droplet 215 of the processing liquid is dropped on the location of the foreign substance 220. The particular location of the foreign substance 220 is acquired as foreign substance location information by a mask pattern inspection apparatus or the like before the processing in FIG. 1A begins. A temperature of the droplet 215 of the processing liquid is, for example, room temperature. When the droplet 215 of the processing liquid is dispensed, the frozen layer 210a is temporarily melted at the location of the foreign substance 220 and a periphery thereof. Also during this processing, the cooling medium 130 is still being continuously supplied to the lower surface side of the substrate 200. Therefore, as illustrated in FIG. 1D, the droplet 215 and the melted processing liquid (hereinafter collectively referred to as a processing liquid droplet) are frozen again forming a frozen processing liquid droplet portion 215a. Further, as the cooling is continued, a crack 215b can be formed in the frozen processing liquid droplet portion 215a, as illustrated in FIG. 1E.

Thereafter, the processing returns to FIG. 1C, and the steps of FIGS. 1C to 1E are executed a predetermined number of times. The time from dispensing of a droplet 215 at the location of the foreign substance 220 to the forming of a crack 215b can be obtained in advance by experiment, and a time slightly longer than the expected time is set as a crack generation time. After the crack generation time elapses after the droplet 215 of the processing liquid is dispensed, another droplet 215 of the processing liquid may be dispensed at the location of the foreign substance 220 again. The droplet 215 is dropped onto the upper surface of the substrate 200 without having to re-form the frozen layer 210a on the entire upper surface of the substrate 200 (as in FIG. 1B). It can be difficult to form the frozen processing liquid droplet portion 215a only at the location of the foreign substance 220 since the droplet 215 of the processing liquid tends to spread over the substrate 200. However, in the first embodiment, since the frozen layer 210a is already formed on the entire upper surface of the substrate 200 in FIG. 1B, the droplet 215 melts an area including the location of the foreign substance 220, and immediately after that, the processing liquid droplet portion 215a begins freezing again. That is, the droplet 215 of the processing liquid can be dispensed at a desired location but not wet and spread substantially around the substrate due to the existence of the frozen layer 210a.

As described above, when the droplet 215 is frozen at the location of the foreign substance 220, the processing liquid that exists between the foreign substance 220 and the substrate 200 expands in freezing, and the foreign substance 220 receives an upward force. If the processing liquid on the periphery of the foreign substance 220 is in a melted state when this occurs, the probability that the foreign substance 220 moves upward increases. For the foreign substance 220 on the substrate 200, a relationship between the number of times of execution of the steps of FIGS. 1C to 1E and a removal rate of the foreign substance 220 can be obtained or estimated, and the steps can be repeated as many times as considered appropriate according to the desired removal rate for the foreign substance 220. For example, a removal rate of 100% may be considered desirable. The required number of times of repeated execution can be obtained for various types of foreign substance 220 (for example, whether it is an organic substance, an inorganic substance, or a metal), and the number of repeated executions may be changed according to the type of the foreign substance 220 when known or expected. For example, when the type of the foreign substance 220 that is likely to be adhered to the substrate 200 is predetermined according to the processing step, the number of times of execution may be changed accordingly. If the removal rate of the foreign substance 220 is 100% for a single execution, the steps of FIGS. 1C to 1E would not need to be repeated.

As illustrated in FIG. 1F, the supply of the cooling medium 130 to the lower surface of the substrate 200 is stopped, a processing liquid 217 at room temperature is supplied to the substrate 200, and the frozen layer 210a is melted. Accordingly, the foreign substance 220 that has been moved upward from the upper surface of the substrate 200 can be cleaned away by the processing liquid 217 and removed. A foreign substance removal processing using the above-described freezing is generally referred to as "freeze cleaning."

Next, a configuration of a substrate processing apparatus to execute the substrate processing method will be described. FIG. 2 is a diagram schematically illustrating an example of the substrate processing apparatus according to the first embodiment. A substrate processing apparatus 10 according to the first embodiment includes a stage 11, a processing liquid supply unit 12, a cooling medium supply unit 13, and a control unit 14.

The stage 11 holds the substrate 200 for the freeze cleaning. The stage 11 corresponds to a substrate holding unit. The stage 11 is provided with a support portion 111 that supports the substrate 200 at a location higher than an upper surface of the stage 11. The support portion 111 supports the substrate 200 at a distance from the upper surface of the stage 11 such that a cooling medium can be brought into contact with the lower surface side of the substrate 200. In addition, a through hole 112 is provided near a center of the stage 11 in a horizontal plane. A portion where the through hole 112 intersects with the upper surface of the stage 11 is referred to as a supply port 113 for the cooling medium. The stage 11 may be configured to be rotatable about an axis that is perpendicular to a substrate placement surface and passes through a center of the substrate placement surface. In this case, the support portion 111 is provided with a stopper that reduces the movement of the substrate 200 in the horizontal direction caused by rotation of the stage 11.

The processing liquid supply unit 12 supplies the processing liquid used for the freeze cleaning. The processing liquid supply unit 12 includes a processing liquid storage unit 121 that stores the processing liquid, a nozzle head 122 having a nozzle 122a for dispensing the processing liquid onto the upper surface of the substrate 200, and a drive mechanism 123 (e.g., a mechanical drive assembly having a nozzle head holder whose position is computer controlled) that moves the nozzle head 122 in the horizontal direction with respect to the stage 11. In addition, the processing liquid supply unit 12 includes a pipe 124 that connects the nozzle head 122 and the processing liquid storage unit 121, a pump 125 that supplies the processing liquid from the processing liquid storage unit 121 to the nozzle 122a via the pipe 124, and a valve 126 that switches the supply of the processing liquid from the processing liquid storage unit 121 to the nozzle 122a.

The cooling medium supply unit 13 supplies a cooling medium for cooling the substrate 200 to a temperature equal to or less than the freezing point of the processing liquid during the freeze cleaning. The cooling medium supply unit 13 includes a cooling medium storage unit 131 that stores the cooling medium, a pipe 132 that connects the cooling medium storage unit 131 to the through hole 112 of the stage 11, and a valve 133 that switches the supply of the cooling medium. As the cooling medium, gas, such as nitrogen gas cooled to a temperature lower than the freezing point of the processing liquid, or a liquid, such as liquid nitrogen or liquid fluorocarbon, may be used. An end portion of the pipe 132 connected to the through hole 112 is the supply port 113 for the cooling medium. The cooling medium supply unit 13 may be referred to as a freezing unit.

The control unit 14 controls operations of the substrate processing apparatus 10 according to a processing recipe or the like. In one example, the control unit 14 includes a processor that is programmed to carry out the functions described below. In another example, the control unit 14 is implemented as a circuit that is configured to carry out the functions described below. The control unit 14 includes a foreign substance location information acquiring unit 141, a cooling control unit 142, and a processing liquid dispensing control unit 143.

The foreign substance location information acquiring unit 141 acquires foreign substance location information regarding the surface of the substrate 200 to be processed. The foreign substance location information is acquired by, for example, a mask pattern inspection apparatus. The foreign substance location information includes information that identifies a location of the foreign substance 220 on the substrate 200.

The cooling control unit 142 controls switching on/off of the supply of the cooling medium during the freeze cleaning. This control is performed, for example, by controlling opening and closing of the valve 133 of the cooling medium supply unit 13.

The processing liquid dispensing control unit 143 controls a dispensing location and a dispensed amount of the processing liquid on the substrate 200 during the freeze cleaning. The processing liquid dispensing control unit 143 dispenses the processing liquid for forming the processing liquid film 210 such that the frozen layer 210a having a predetermined thickness over the entire upper surface of the substrate 200 can be formed from the processing liquid film 210. After the processing liquid film 210 is frozen, the drive mechanism 123 is controlled to move the nozzle 122a to the location of the foreign substance 220 according to the foreign substance location information, and a droplet (or droplets) of a predetermined amount of processing liquid is dispensed at the location of the foreign substance 220. Coordinates that serve as a reference point for the foreign substance location information and a reference location on the substrate 200 on the stage 11 are associated with each other, and then the processing liquid dispensing control unit 143 gives an instruction to the drive mechanism 123 such that the nozzle 122a is disposed at the location of the foreign substance 220 according to the foreign substance location information. The processing of dispensing the droplet of the processing liquid to the location of the foreign substance 220 can be performed one or more times. When the processing recipe is set such that the droplet of the processing liquid will be dispensed a plurality of times, the processing for dispensing the droplet of the processing liquid is repeated after the above-described crack generation time has elapsed from the dispensing of the previous droplet.

In FIG. 2, the supplying of the processing liquid for forming the frozen layer 210a and the dispensing of the processing liquid droplet at the location of the foreign substance 220 are performed using the same nozzle head 122, but in some examples different nozzle heads may be used for the different functions.

Figure 3:
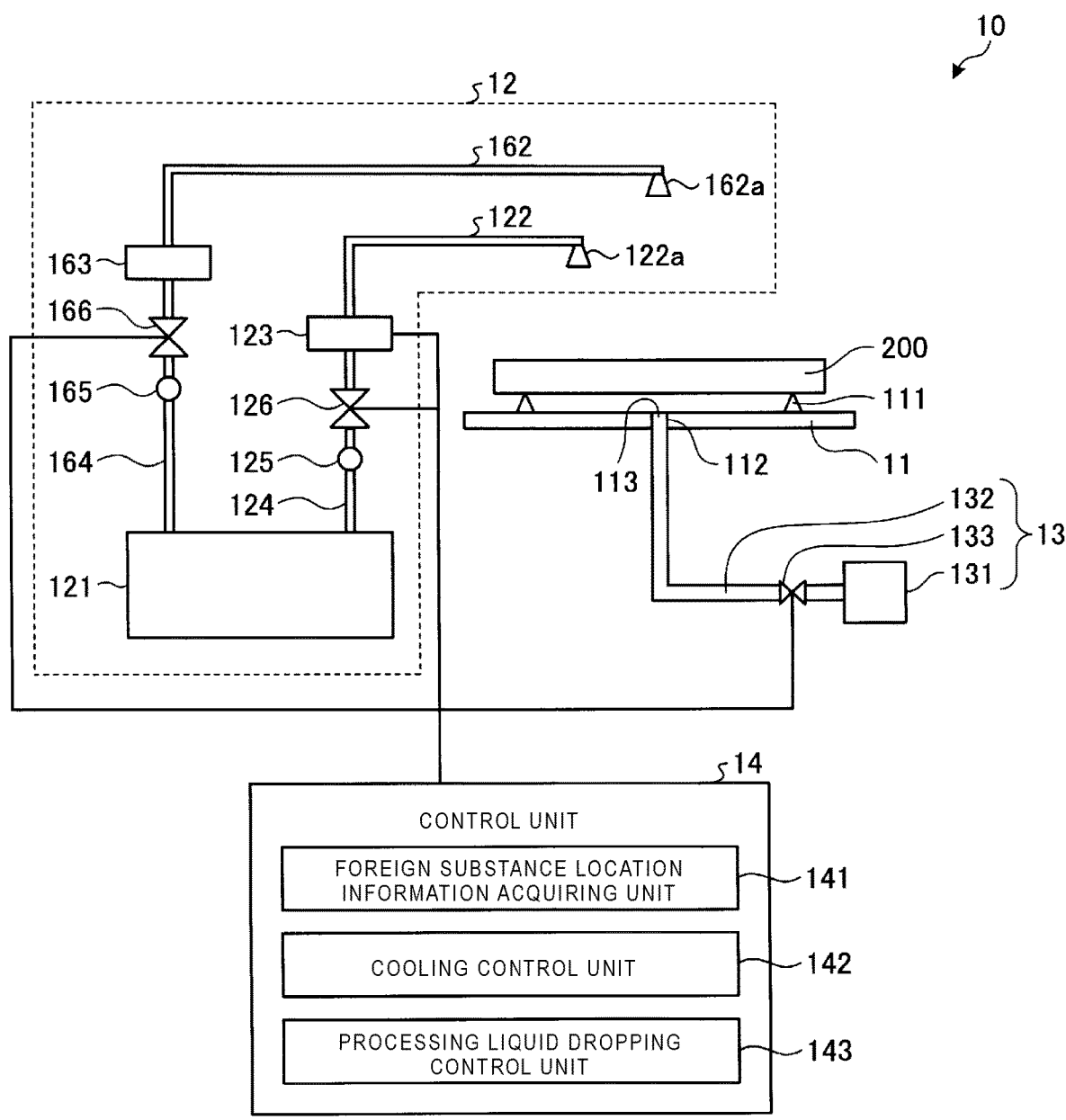
FIG. 3 is a diagram schematically illustrating another example of a substrate processing apparatus according to a first embodiment.

FIG. 3 is a diagram schematically illustrating another example of the configuration of the substrate processing apparatus according to the first embodiment. Here, portions different from those in FIG. 2 will be described. In addition to the configuration of the first embodiment, the processing liquid supply unit 12 includes a nozzle head 162 having a nozzle 162a for supplying a processing liquid to the upper surface of the substrate 200 for forming the processing liquid film 210 to become the frozen layer 210a, and a drive mechanism 163 for swinging the nozzle head 162 in a horizontal plane. In addition, the processing liquid supply unit 12 includes a pipe 164 that connects the nozzle head 162 and the processing liquid storage unit 121, a pump 165 that supplies the processing liquid from the processing liquid storage unit 121 to the nozzle 162a via the pipe 164, and a valve 166 that switches the supply of the processing liquid from the processing liquid storage unit 121 to the nozzle 162a.

That is, in FIG. 3, the nozzle head 162 is used when the processing liquid film 210 is formed, and the nozzle head 122 is used when the processing liquid is dispensed at the location of the foreign substance 220 in the frozen layer 210a.

In FIGS. 2 and 3, the case that the nozzle head 122 is driven by the drive mechanism 123 such that the nozzle 122a is moved to a location on the stage 11 is one example, and the embodiments are not limited thereto. In general, as long as the nozzle 122a and the stage 11 are movable relative to each other, substantially the same disclosed effects can be provided. For example, a location of the nozzle 122a can be fixed and the stage 11 may be configured to be movable in the horizontal plane by a drive mechanism, or the nozzle 122a and the stage 11 may both be configured to be movable in the horizontal plane by drive mechanisms.

In the first embodiment, a processing liquid film 210 is formed on the upper surface of the substrate 200, and the lower surface of the substrate 200 is cooled by the cooling medium 130 to freeze the processing liquid film 210 to form the frozen layer 210a. Next, the droplet of the processing liquid is dispensed at the location of the foreign substance 220 in the frozen layer 210a, the frozen layer 210a at the droplet landing location is melted, and then the processing of forming the frozen processing liquid droplet portion 215a by freezing the processing liquid droplet 215 is executed a number of times. Thereafter, the cooling by the cooling medium 130 is stopped, and then the frozen layer 210a including the frozen processing liquid droplet portion 215a is melted and removed. Accordingly, while the foreign substance 220 on the upper surface of the substrate 200 is removed, damage from the freeze cleaning to the pattern disposed on the upper surface of the substrate 200 in an area where the foreign substance 220 does not exist can be reduced.

As compared with a case where the formation and the melting of the frozen layer 210a are repeated over the entire upper surface of the substrate 200, the amount of processing liquid to be used can be reduced, and the cost required for manufacturing the semiconductor device can thus be reduced. Further, as compared with the case where the formation and the melting of the frozen layer 210a are repeated over the entire upper surface of the substrate 200, the time required for the freeze cleaning can also be shortened.

Second Embodiment

In the first embodiment, when a droplet of a processing liquid is dispensed at a location of a foreign substance, a frozen layer was formed on an entire upper surface of a substrate so that the droplet does not wet and spread. In a second embodiment, a substrate processing method is described in which a droplet can be dispensed at a desired location to form a frozen processing liquid droplet portion without forming a frozen layer on the entire upper surface of the substrate.

FIGS. 4A to 4D are diagrams schematically illustrating an example of a procedure of the substrate processing method according to the second embodiment. As illustrated in FIG. 4A, the substrate 200 is placed on the stage 11. The surface of the substrate 200 that is to be cleaned has been hydrophobized. The substrate 200 is placed with the surface to be cleaned facing upward. The foreign substance 220 is adhered to the substrate 200. When the substrate 200 is exposed to air, the exposed surface can be contaminated by organic substances in the air. The exposed surface of the substrate is also naturally hydrophobized upon exposure to air. However, in this example, the surface of the substrate 200 on which the freeze cleaning is to be performed has been intentionally hydrophobized in a previous processing. For example, the surface of the substrate 200 is hydrophobized with hexamethyldisilazane (HMDS) processing in which hydrophilic groups on the surface of the substrate 200 are replaced with a hydrophobic group.

A cooling medium at a temperature lower than a solidification temperature of the processing liquid is supplied to a lower surface side of the substrate 200 to cool the substrate 200. As the cooling medium, gas such as nitrogen gas cooled to a temperature lower than a freezing point of the processing liquid, or a liquid such as liquid nitrogen or liquid fluorocarbon may be used.

Then, as illustrated in FIG. 4B, the droplet 215 of the processing liquid is dispensed at the location of the foreign substance 220. The location of the foreign substance 220 is acquired before cleaning by a mask pattern inspection apparatus or the like similarly with the first embodiment. Since the upper surface of the substrate 200 is hydrophobized, the droplet 215 dispensed on the substrate 200 will tend to be shaped in a manner which wraps around the foreign substance 220 without spreading.

Thereafter, as illustrated in FIG. 4C, since the substrate 200 is being cooled by the cooling medium, the droplet 215 will be frozen and the frozen processing liquid droplet portion 215a is formed. Further, as illustrated in FIG. 4D, a crack 215b is formed in the frozen processing liquid droplet portion 215a.

Thereafter, the processing returns to FIG. 4B, and the processing of FIGS. 4B to 4D is executed a predetermined number of times. When these steps are repeated, similarly as with the first embodiment, the droplet 215 is dispensed again to the location of the foreign substance 220 after a crack generation time elapses, which is set slightly longer than the time from the dispensing of the droplet 215 of the processing liquid to formation of the crack in the frozen processing liquid droplet portion 215a. The droplet 215 dispensed for a second or later time melts the previous frozen processing liquid droplet portion 215a and a new frozen processing liquid droplet portion 215a is formed.

Also in this case, as described in the first embodiment, repeating the freezing and the melting of the processing liquid droplet at the location of the foreign substance 220 increases the probability that the foreign substance 220 moves upward. The number of times of execution of the steps in FIGS. 4B to 4D can be obtained for each type of foreign substance 220 and may be varied according to the expected or known type of the foreign substance 220 to be removed. When a single processing (e.g., only one droplet dispensed) is considered to remove the foreign substance 220 at 100% removal rate, the steps of FIGS. 4B to 4D need not be repeated.

Thereafter, similarly to FIG. 1F, the supply of the cooling medium 130 to the lower surface of the substrate 200 is stopped, processing liquid at normal temperature is supplied to the substrate 200, and the frozen processing liquid droplet portion 215a is melted. Accordingly, the foreign substance 220 that has been moved upward from the surface of the substrate 200 is cleaned away by the processing liquid 217.

The substrate processing apparatus 10 that executes the substrate processing method according to the second embodiment has a similar configuration with that of FIG. 2 of the first embodiment. However, in this case, the processing liquid dropping control unit 143 does not execute the processing of forming the frozen layer 210a having a predetermined thickness on the entire surface of the substrate 200. When the substrate processing apparatus 10 illustrated in FIG. 3 is used, the nozzle head 162 of the processing liquid supply unit 12 is used to supply the processing liquid to the upper surface of the substrate 200 during final melting and cleaning of the freeze cleaning processing.

According to the second embodiment, once the surface of substrate 200 that has been hydrophobized is cooled, the processing liquid is dropped only at the location of the foreign substance 220 to execute the freezing and the melting of the processing liquid droplet. Accordingly, while the foreign substance 220 can be removed, damage that might occur in the freeze cleaning to a pattern on the substrate 200 in an area where the foreign substance 220 is not present can be reduced. Since the frozen layer 210a is not formed on the entire upper surface of the substrate 200, the amount of the processing liquid to be used in the cleaning process can be reduced as compared with the first embodiment.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A substrate processing method, comprising:
   dispensing processing liquid onto a substrate having a first surface to form a liquid film covering the first surface;
   cooling the substrate to below a freezing point of the processing liquid using a cooling fluid brought into contact with a second surface of the substrate opposite the first surface to form a frozen layer of processing liquid from the liquid film on the first surface;
   dispensing a droplet of processing liquid onto the frozen layer of processing liquid on the first surface at a specified location to thaw a portion of the frozen layer of processing liquid at the specified location;
   forming a frozen droplet portion at the specified location, the frozen droplet portion comprising the dispensed droplet of processing liquid and the thawed portion of the frozen layer; and
   thawing the frozen droplet portion.

2. The substrate processing method according to claim 1, wherein the forming and thawing of the frozen droplet portion is repeated.

3. The substrate processing method according to claim 1, further comprising:
   acquiring foreign substance location information including the specified location on the first surface of the substrate.

4. The substrate processing method according to claim 1, further comprising:
   hydrophobizing the first surface before cooling the substrate.

5. The substrate processing method according to claim 1, further comprising:
   applying hexamethyldisilazane to the first surface before cooling the substrate.

6. A substrate processing method, comprising:
   acquiring a location of a foreign substance on a first surface of a substrate;
   dispensing a processing liquid on the first surface of the substrate and forming a film of processing liquid over the first surface;
   cooling the substrate to below a freezing point of the processing liquid by contacting a second surface of the substrate opposite the first surface with a cooling fluid and forming a frozen film of processing liquid on the first surface of the substrate;
   dispensing a droplet of processing liquid onto the frozen film of processing liquid on the first surface of the substrate at the location of the foreign substance to thaw a portion of the frozen film at the location;

forming a frozen droplet portion at the location, the frozen droplet portion comprising the dispensed droplet of processing liquid and the thawed portion of the frozen film; and thawing and removing the processing liquid including the frozen droplet portion from the first surface.

7. The substrate processing method of claim 6, wherein the processing liquid comprises water.

8. The substrate processing method of claim 6, wherein a plurality of droplets of processing liquid is dispensed at the location of the foreign substance.

9. The substrate processing method of claim 8, wherein a length of time between dispensing of droplets is set to be greater than an expected crack generation time for the frozen droplet portion.

10. The substrate processing method according to claim 6, further comprising:

hydrophobizing the first surface before dispensing the processing liquid on the first surface of the substrate and forming the film of processing liquid over the entire first surface.

11. The substrate processing method according to claim 10, wherein the hydrophobizing the first surface is performed by application of hexamethyldisilazane.

12. The substrate process method according to claim 6, wherein the substrate is an imprint template.

* * * * *